United States Patent
Ikuta et al.

(10) Patent No.: US 8,816,481 B2
(45) Date of Patent: Aug. 26, 2014

(54) SEMICONDUCTOR DEVICE HAVING A POROUS NICKEL PLATING PART

(71) Applicant: Panasonic Corporation, Osaka (JP)

(72) Inventors: Keiko Ikuta, Osaka (JP); Lianji Jin, Osaka (JP); Takayuki Hirose, Osaka (JP); Toshiyuki Kojima, Kyoto (JP); Norihito Tsukahara, Kyoto (JP); Kohichi Tanda, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/822,838

(22) PCT Filed: Oct. 1, 2012

(86) PCT No.: PCT/JP2012/006277
§ 371 (c)(1),
(2), (4) Date: Mar. 13, 2013

(87) PCT Pub. No.: WO2013/065230
PCT Pub. Date: May 10, 2013

(65) Prior Publication Data
US 2014/0054757 A1 Feb. 27, 2014

(51) Int. Cl.
*H01L 23/00* (2006.01)
*C25D 5/48* (2006.01)
*C25D 3/12* (2006.01)
*H01L 23/36* (2006.01)
*C25D 7/00* (2006.01)
*C25D 5/02* (2006.01)
*H01L 23/495* (2006.01)

(52) U.S. Cl.
CPC .............. *H01L 23/495* (2013.01); *H01L 24/32* (2013.01); *C25D 5/48* (2013.01); *C25D 3/12* (2013.01); *H01L 24/00* (2013.01); *H01L 23/49562* (2013.01); *H01L 23/36* (2013.01); *C25D 7/00* (2013.01); *H01L 23/49582* (2013.01); *C25D 5/022* (2013.01); *H01L 23/49513* (2013.01)
USPC ........................................................ 257/666

(58) Field of Classification Search
CPC ................................................ H01L 23/49582
USPC .................................................. 257/666, 667
See application file for complete search history.

(56) References Cited

U.S. PATENT DOCUMENTS

2009/0317556 A1* 12/2009 Macary ......................... 427/438
2010/0090331 A1* 4/2010 Joshi et al. .................... 257/692

(Continued)

FOREIGN PATENT DOCUMENTS

JP 8-204081 A 8/1996
JP 10-13006 A 1/1998

(Continued)

OTHER PUBLICATIONS

International Search Report for PCT/JP2012/006277, Nov. 13, 2012.

*Primary Examiner* — Nathan Ha
(74) *Attorney, Agent, or Firm* — RatnerPrestia

(57) ABSTRACT

A semiconductor device which can reduce a heat stress to a solder layer while suppressing an increase of thermal resistance is provided. A semiconductor device includes a semiconductor element, a solder layer which is arranged on at least one surface of the semiconductor element and a lead frame which is arranged on the solder layer so that a porous nickel plating part is sandwiched between the lead frame and the solder layer. Compared with a case that the semiconductor element and the lead frame are jointed by a solder directly, an increased part of a thermal resistance of the solder junction is held down only to a part of the porous nickel plating part and a thermal resistance applied to the solder layer can be reduced.

12 Claims, 11 Drawing Sheets

(56) References Cited

U.S. PATENT DOCUMENTS

| | | |
|---|---|---|
| 2010/0098996 A1* | 4/2010 | Hwang et al. .................. 429/33 |
| 2010/0187678 A1 | 7/2010 | Kajiwara et al. |
| 2010/0323243 A1* | 12/2010 | Yoshida et al. ............ 429/218.2 |
| 2012/0001316 A1* | 1/2012 | Hauenstein .................. 257/690 |
| 2012/0007234 A1* | 1/2012 | Tsai et al. .................... 257/737 |
| 2012/0061851 A1* | 3/2012 | Rathburn ..................... 257/774 |
| 2012/0064667 A1* | 3/2012 | Joshi et al. ................... 438/107 |
| 2012/0104580 A1* | 5/2012 | Feng et al. ................... 257/673 |
| 2012/0107973 A1* | 5/2012 | Grotsch et al. ................. 438/26 |
| 2013/0256856 A1* | 10/2013 | Mahler et al. ................ 257/676 |

FOREIGN PATENT DOCUMENTS

| | | |
|---|---|---|
| JP | 2002-237556 A | 8/2002 |
| JP | 2005-159048 A | 6/2005 |
| JP | 2008-50673 A | 3/2008 |
| JP | 2010-171271 A | 8/2010 |
| JP | 2011-23654 A | 2/2011 |

* cited by examiner

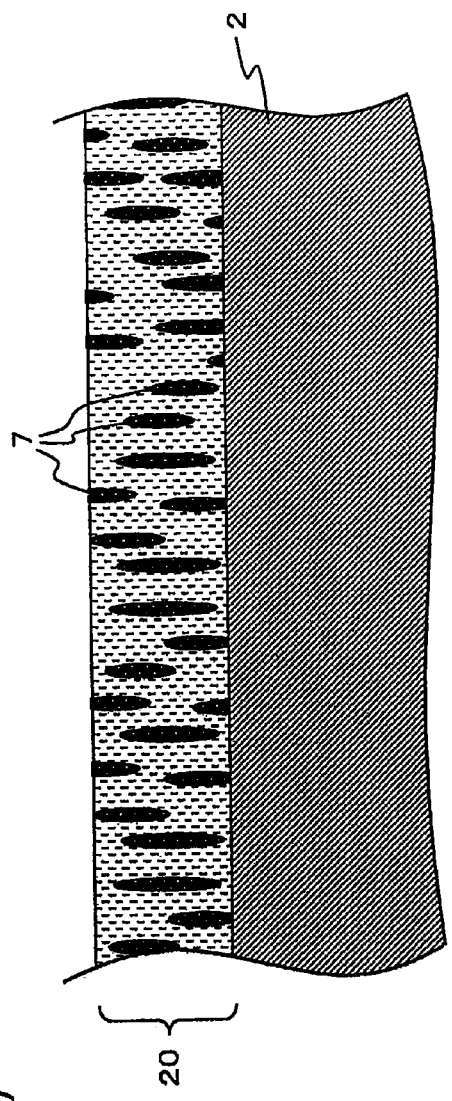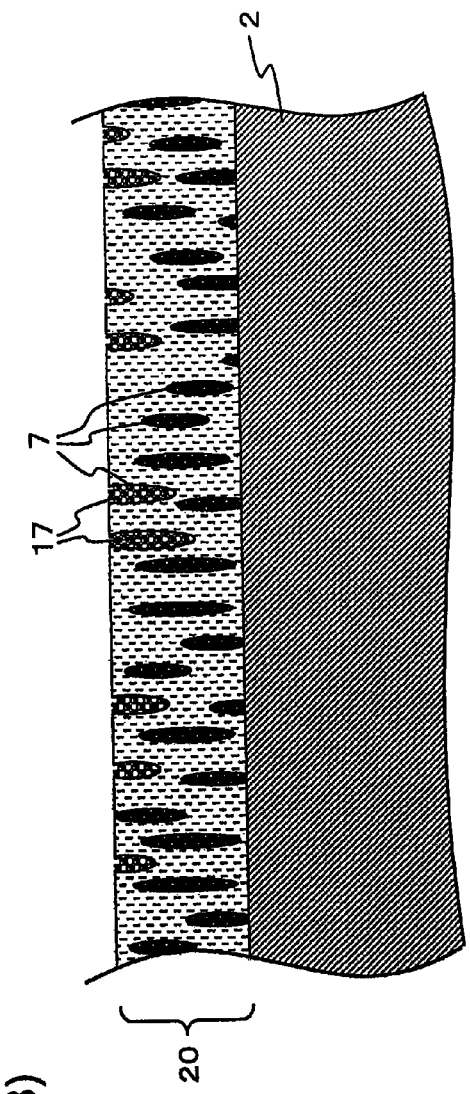

SEMICONDUCTOR DEVICE HAVING A POROUS NICKEL PLATING PART

CROSS-REFERENCE TO RELATED APPLICATIONS

This application is a U.S. National Phase Application of PCT International Patent Application No. PCT/JP2012/006277, filed Oct. 1, 2012, claiming the benefit of priority of Japanese Patent Application No. 2011-241873, filed Nov. 4, 2011 and Japanese Patent Application No. 2012-002067, filed Jan. 10, 2012, all of which are incorporated by reference herein in their entirety.

BACKGROUND OF THE INVENTION

1. Field of the Invention

The present invention relates to a semiconductor device and a method of manufacturing the semiconductor device.

2. Related Art of the Invention

A semiconductor device in which a power semiconductor element is jointed to a lead frame on an insulator directly is known.

FIG. 11(A) shows a schematic sectional view showing a structure of a junction part between a power semiconductor element and a lead frame in such a conventional power semiconductor device.

A surface of one side of the lead frame 304 is fixed on an insulator 305 an undersurface of which is arranged with contact on a heat radiation plate 306. Another surface of the lead frame 304 is jointed to a power semiconductor element 301 through a solder layer 302.

Thus, the solder 302 has been conventionally used for junction of the power semiconductor element 301 and the lead frame 304. However, since a coefficient of linear expansion of the lead frame 304 and a coefficient of linear expansion of the power semiconductor element 301 are greatly different, large heat stress is repeatedly impressed to the solder layer 302 of the solder junction by a power cycle at the time of making the power semiconductor device drive, finally, a solder crack occurs and there is a problem of becoming poor junction.

On the other hand, in order to reduce a heat stress and a heat warp which occur by the difference of the coefficients of linear expansion between the members, a structure where a heat-conducting porous metal plate is arranged between the members with a large difference of the coefficients of linear expansion, and the heat-conducting porous metal plate and each of the members are jointed by the solder, is proposed (see for example Japanese Laid Open Patent Publication No. 2002-237556).

The inventor of the invention considers that the structure proposed in Japanese Laid Open Patent Publication No. 2002-237556 is applied to the solder junction of the conventional power semiconductor device of the structure shown in FIG. 11(A) in order to reduce the heat stress applied to the solder layer 302.

FIG. 11(B) shows a schematic sectional view showing a junction part between the power semiconductor element and the lead frame when the heat-conducting porous metal plate is arranged on the conventional power semiconductor device shown in FIG. 11(A).

The power semiconductor element 301 and the lead frame 304 which have a large difference of the coefficients of linear expansion are jointed to a heat-conducting porous metal plate 303 which is held between two solder layers 302a and 302b.

The porous metal plate 303 comprises a heat-conducting metal such as copper or aluminum with a large thermal conductivity and a large coefficient of linear expansion.

The porous metal plate 303 reduces the heat stresses which are applied to the solder layers 302a and 302b as a stress buffering plate, and an occurrence of the solder crack can be suppressed.

DISCLOSURE OF THE INVENTION

Problems to be Solved by the Invention

However, when the heat-conducting porous metal plate is arranged between the power semiconductor element and the lead frame which have the large difference of the coefficients of linear expansion, a thermal resistance of the junction between the power semiconductor element and the lead frame increases greatly although the heat stress can be reduced.

That is, with the composition which arranges the porous metal plate 303 shown in FIG. 11(B) compared with the conventional composition as shown in FIG. 11(A) in which the power semiconductor element 301 and the lead frame 304 are simply jointed by the solder layer 302 of one layer, since it becomes a structure in which the porous metal plate 303 and the solder layer 302b are added, the thermal resistance of the junction increases greatly.

In view of the above-mentioned problem, an aspect of the present invention is to provide a semiconductor device and a method of manufacturing the semiconductor device, which can reduce a heat stress to the solder layers and can suppress an occurrence of a solder crack, with suppressing an increase of thermal resistance of a junction.

SUMMARY OF THE INVENTION

In order to solve the problems described above, the $1^{st}$ aspect of the present invention is a semiconductor device comprising:

a semiconductor element;

a solder layer which is arranged on at least one surface of the semiconductor element; and a lead frame which is arranged on the solder layer so that a porous nickel plating part is sandwiched between the lead frame and the solder layer.

Moreover, the $2^{nd}$ aspect of the present invention is the semiconductor device according to the $1^{st}$ aspect of the present invention, wherein a thickness of the porous nickel plating part is 10 μm or more and 100 μm or less and a porosity of the porous nickel plating part is 20% or more and 60% or less.

Moreover, the $3^{rd}$ aspect of the present invention is the semiconductor device according to the $1^{st}$ aspect of the present invention, wherein the porous nickel plating part is applied to the lead frame.

Moreover, the $4^{th}$ aspect of the present invention is the semiconductor device according to the $1^{st}$ aspect of the present invention, wherein a coefficient of linear expansion of the porous nickel plating part is larger than a coefficient of linear expansion of the semiconductor element, and smaller than a coefficient of linear expansion of the lead frame.

Moreover, the $5^{th}$ aspect of the present invention is the semiconductor device according to the $1^{st}$ aspect of the present invention, comprising:

another solder layer which is arranged on such opposite surface of the semiconductor element, the opposite surface being opposite to the one surface of the semiconductor element on which the solder layer is arranged; and another lead frame which is arranged on the another solder layer so that another porous nickel plating part is sandwiched between the another lead frame and the another solder layer.

Moreover, the 6th aspect of the present invention is the semiconductor device according to the 1st aspect of the present invention, wherein the porous nickel plating part has many pores, and particles having a thermal conductivity which is higher than that of nickel, are embedded in the pores which are located at a junction part of the porous nickel plating part to the solder layer.

Moreover, the 7th aspect of the present invention is the semiconductor device according to the 6th aspect of the present invention, wherein a coefficient of linear expansion of the porous nickel plating part in which the particles are embedded, is larger than a coefficient of linear expansion of the semiconductor element, and smaller than a coefficient of linear expansion of the lead frame.

Moreover, the 8th aspect of the present invention is the semiconductor device according to the 6th aspect of the present invention, wherein the particles embedded in the pores are particles of a carbon material.

Moreover, the 9th aspect of the present invention is the semiconductor device according to the 6th aspect of the present invention, wherein a thickness of the porous nickel plating part is 10 μm or more and 200 μm or less and a porosity of the porous nickel plating part is 20% or more and 60% or less.

Moreover, the 10th aspect of the present invention is the semiconductor device according to the 6th aspect of the present invention, wherein a diameter of the particle embedded in the pore is 4 nm or more and 50 nm or less.

Moreover, the 11th aspect of the present invention is the semiconductor device according to the 6th aspect of the present invention, further comprising:

another solder layer which is arranged on such opposite surface of the semiconductor element, the opposite surface being opposite to the one surface of the semiconductor element on which the solder layer is arranged; and another lead frame which is arranged on the another solder layer so that another porous nickel plating part having many pores is sandwiched between the another lead frame and the another solder layer, wherein particles having a thermal conductivity which is higher than that of nickel, are embedded in the pores which are located at a junction part of the another porous nickel plating part to the another solder layer.

Moreover, the 12th aspect of the present invention is a method of manufacturing a semiconductor device comprising:

a porous nickel plating step of applying a porous nickel plating to a lead frame; and a solder junction step of joining a side of the lead frame to which the porous nickel plating is applied, to a semiconductor element, by using a solder.

Moreover, the 13th aspect of the present invention is the method of manufacturing the semiconductor device according to the 12th aspect of the present invention, further comprising:

a particle embedding step of embedding particles having a thermal conductivity which is higher than that of nickel, into pores which are located at a part of the porous nickel plating that is applied to the lead frame in the porous nickel plating step.

Moreover, the 14th aspect of the present invention is the method of manufacturing the semiconductor device according to the 12th aspect of the present invention, wherein in the porous nickel plating step, the porous nickel plating is selectively applied to a surface of a side to be joined to the semiconductor element, of the lead frame.

Moreover, the 15th aspect of the present invention is a semiconductor device which is manufactured by the method of manufacturing the semiconductor device according to the 12th aspect of the present invention, wherein a coefficient of linear expansion of the porous nickel plating part is larger than a coefficient of linear expansion of the semiconductor element, and smaller than a coefficient of linear expansion of the lead frame.

Moreover, the 16th aspect of the present invention is a semiconductor device which is manufactured by the method of manufacturing the semiconductor device according to the 13th aspect of the present invention, wherein a coefficient of linear expansion of the porous nickel plating part in which the particles are embedded, is larger than a coefficient of linear expansion of the semiconductor element, and smaller than a coefficient of linear expansion of the lead frame.

Moreover, the 17th aspect of the present invention is the semiconductor device according to the 2nd aspect of the present invention wherein the porous nickel plating part is applied to the lead frame.

Moreover, the 18th aspect of the present invention is the semiconductor device according to the 7th aspect of the present invention, wherein the particles embedded in the pores are particles of a carbon material.

Moreover, the 19th aspect of the present invention is the method of manufacturing the semiconductor device according to the 13th aspect of the present invention wherein in the porous nickel plating step, the porous nickel plating is selectively applied to a surface of a side to be joined to the semiconductor element, of the lead frame.

By applying the porous nickel plating, a layer with a low coefficient of linear expansion and a low modulus of elasticity lies between the semiconductor element and the lead frame. Thereby, even when the semiconductor element heats, the lead frame expands greatly and a distortion occurs in the plating layer, the heat stress induced on the solder layer is eased since the modulus of elasticity of the plating layer is low.

A heat warp is induced on the solder layer by the difference of the coefficients of linear expansion of the plating layer and the semiconductor element, but the difference is small, and the heat stress to the solder layer becomes small.

In the semiconductor device in the present invention, the heat stress to the junction can be reduced by only applying the porous nickel plating to the lead frame and only jointing it to the semiconductor element by solder, that is, only one solder layer is required for junction. Thereby, compared with a simple solder junction, an increased part of the thermal resistance of the present invention is held down only to that of the part of the porous nickel plating layer.

Advantageous Effects of Invention

The present invention can provide a semiconductor device and a method of manufacturing the semiconductor device which can reduce a heat stress to the solder layers and can suppress an occurrence of a solder crack, with suppressing an increase of thermal resistance of a junction.

BRIEF DESCRIPTION OF THE DRAWINGS

FIG. 8(A) is a schematic sectional view of the porous nickel plating after the plating step is done according to the second embodiment of the present invention;

FIG. 8(B) is a schematic sectional view of the porous nickel plating after the particle embedding step is done according to the second embodiment of the present invention;

PREFERRED EMBODIMENTS OF THE INVENTION

Embodiments of the present invention are described below with reference to the drawings.

First Embodiment

Figure 1:
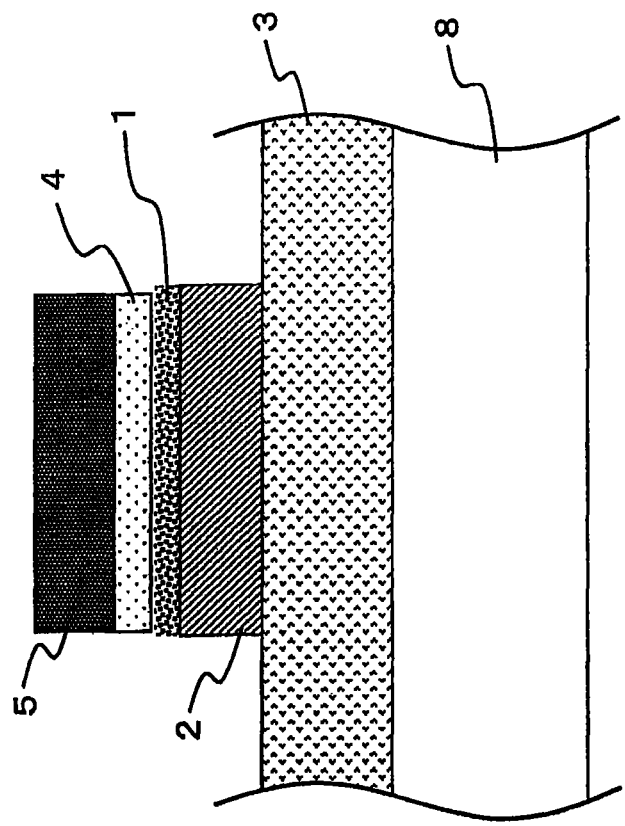
FIG. 1 is a schematic sectional view showing an arrangement of a power semiconductor device according to a first embodiment of the present invention.

FIG. 1 is a schematic sectional view showing an arrangement of a power semiconductor device according to a first embodiment of the present invention.

A surface of one side of a lead frame 2 is fixed on an insulator 3 an undersurface of which is arranged with contact on a heat radiation plate 8. Another surface of the lead frame 2, to which a porous nickel plating 1 is applied, is jointed to a power semiconductor element 5 through a solder layer 4.

The power semiconductor element 5 corresponds to an example of a semiconductor element according to the present invention.

Figure 2:
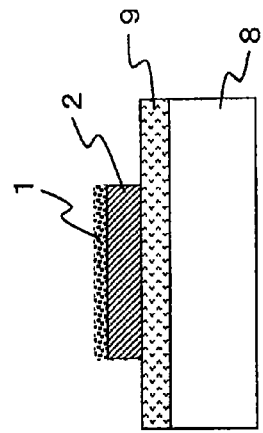
FIG. 2(A) is a diagram showing a plating step in a manufacturing process of the power semiconductor device according to the first embodiment of the present invention.
FIG. 2(B) is a diagram showing a lead frame fixing step in the manufacturing process of the power semiconductor device according to the first embodiment of the present invention.
FIG. 2(C) is a diagram showing a solder junction step in the manufacturing process of the power semiconductor device according to the first embodiment of the present invention.
Figure 2:
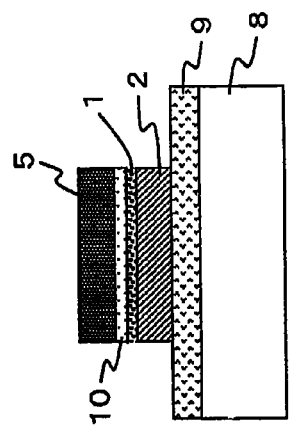
Figure 2:
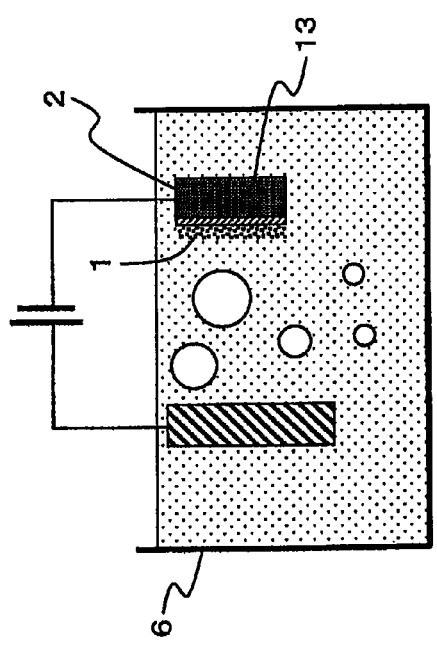

For example, the arrangement of the power semiconductor device is manufactured by steps of FIG. 2(A) to FIG. 2(C).

FIG. 2(A) to FIG. 2(C) are process drawings of examples of a manufacturing process of the power semiconductor device of the first embodiment. FIG. 2(A) shows a plating step, FIG. 2(B) shows a lead frame fixing step and FIG. 2(C) shows a solder junction step.

First, as shown in FIG. 2(A), the porous nickel plating 1 is applied on the lead frame 2.

For example, the porous nickel plating 1 is obtained by soaking the lead frame 2 in a nickel plating tank 6 in which the foaming agent is put, and applying electroplating to it. In FIG. 2(A), a mask 13 is attached to the lead frame 2, and the porous plating 1 is applied selectively to only the side surface which is jointed to the power semiconductor element 5 by solder. At this time, a thickness and a porosity of the porous nickel plating 1 are controllable by adjusting an electric current density passed to the lead frame 2, and a plating time.

Figure 3:
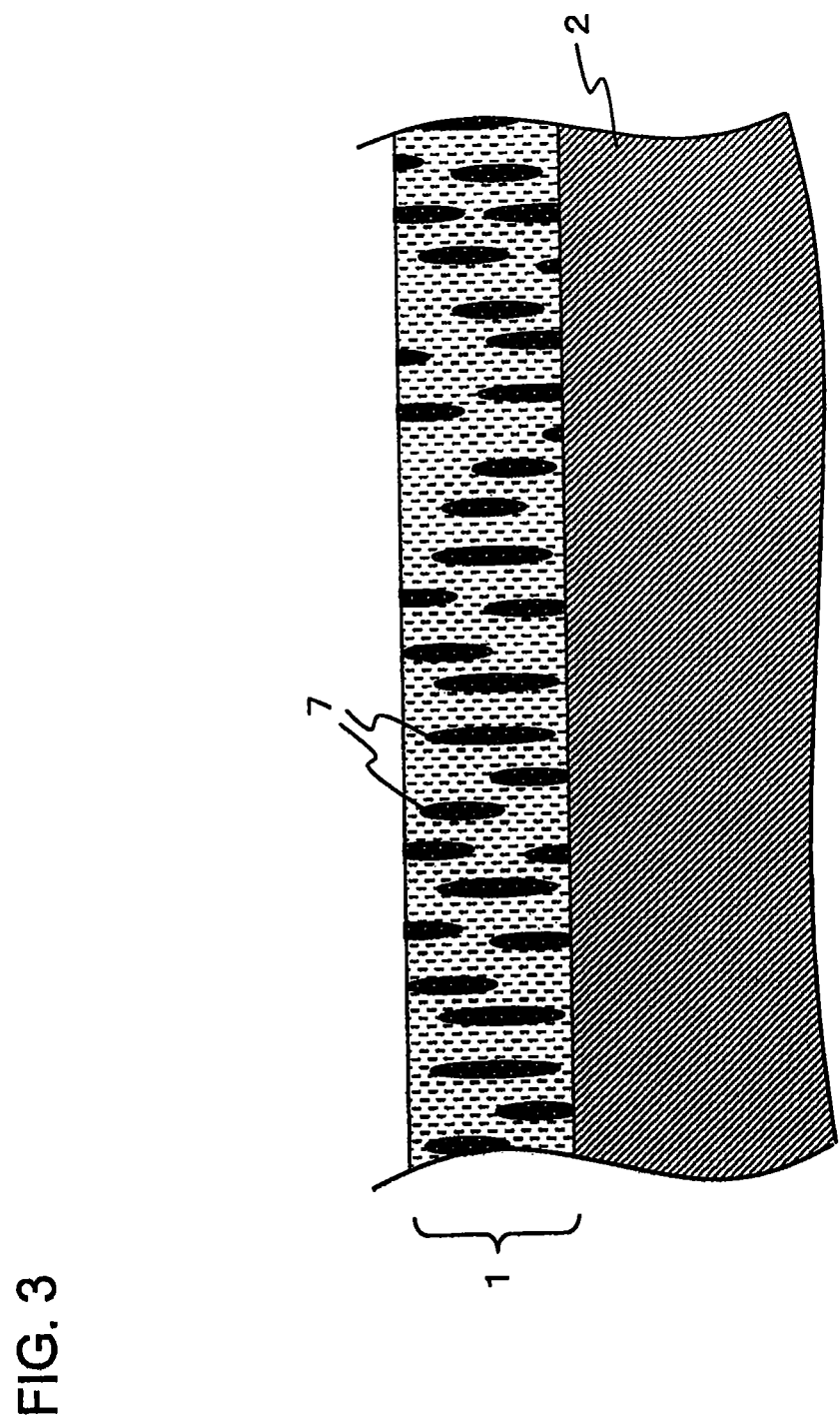
FIG. 3 is a schematic sectional view of a porous nickel plating according to the first embodiment of the present invention.

FIG. 3 shows a schematic sectional view of the porous nickel plating 1 which is applied on the surface of the lead frame 2.

The porous nickel plating 1 which is applied on the lead frame 2 corresponds to an example of a porous nickel plating part according to the present invention.

A pore 7 of the porous nickel plating is 10 μm or more and 15 μm or less in height and needlelike. As the porosity becomes large, a diameter of the pore 7 becomes larger.

The porous nickel plating 1 is not limited to be applied selectively to only the part which is jointed to the power semiconductor element 5 by solder as shown in FIG. 2(A) but can be applied on the whole surface of the lead frame 2. However, it is more desirable to apply the porous nickel plating 1 only to the part which is jointed by the solder selectively, in order to suppress the increase in thermal resistance of the part which is not jointed to the power semiconductor element 5.

When a coefficient of linear expansion of the porous nickel plating 1 is smaller than a coefficient of linear expansion of the lead frame 2, and larger than a coefficient of linear expansion of the semiconductor element 5, the heat stress applied to the solder layer 4 can be reduced effectively. It is thought that the coefficient of linear expansion of the porous nickel plating 1 is equivalent to the value obtained by multiplying a coefficient (12.8 ppm) of linear expansion of nickel by (100−porosity) %. Since the coefficient of linear expansion of the power semiconductor element 5 is about 4 ppm or more and 5 ppm or less, the porosity of the porous nickel plating 1 needs to be 60% or less.

When the porosity of the porous nickel plating 1 is smaller than 20%, a deviation occurs in the number of pores per unit volume, and the porous nickel plating layer of uniform porosity cannot be obtained.

As mentioned above, it is desirable that the porosity of the porous nickel plating 1 is 20% or more and 60% or less.

Further, the pore 7 of the porous nickel plating 1 is 10 μm or more and 15 μm or less in height and needlelike. Therefore when the thickness of the porous nickel plating 1 is smaller than 10 μm, plating thickness varies and a uniform porous nickel plating layer cannot be obtained. And, in the first embodiment, when the thickness is larger than 100 μm, the thermal resistance of the porous nickel plating layer increases, and a productivity worsens because the plating time becomes long.

Thereby, in the first embodiment, it is desirable that the thickness of the porous nickel plating 1 is 10 μm or more and 100 μm or less. When the porous nickel plating 1 has a certain amount of thickness, a distortion induced on the solder layer 4 decreases and the heat stress is eased. It is more desirable that the thickness of the porous nickel plating 1 is 20 μm or more and 100 μm or less, so that the stress reduction to the solder layer 4 is more effective.

Though copper or aluminum is desirable as a material of the lead frame 2, the copper which has large electric conductivity and large thermal conductivity is more desirable.

The porous nickel plating 1 is applied to the lead frame 2 directly in the above, but the porous nickel plating 1 can be applied to the lead frame 2 to which another surface treatment has been applied in advance.

Next, as shown in FIG. 2(B), the lead frame 2 to which the porous nickel plating 1 has been applied is fixed on an insulating resin 9. Here, the insulating resin 9 is used as the insulator 3.

The lead frame 2 to which the porous nickel plating 1 has been applied is placed on the insulating resin 9 expanded on the heat radiation plate 8 so that the lead frame 2 does not come into contact with the heat radiation plate 8 and one surface of the lead frame 2 is exposed on the insulating resin 9, and the lead frame 2 is fixed on the insulating resin 9 by curing the insulating resin 9.

Next, as shown in FIG. 2(C), a cream solder 10 is screen-printed to the exposed surface of the lead frame 2, the power semiconductor element 5 is placed on that, and the arrangement of the present invention is constructed. A suitable cream solder is selected as the cream solder 10, according to the environment in which the semiconductor device having the arrangement of the present invention is used.

When the cream solder 10 is printed to the power semiconductor element 5, in order to suppress the increase in the thermal resistance, the cream solder 10 is supplied so that a thickness of the cream solder 10 becomes 50 μm or more and 100 μm or less.

Next, when this structure is passed through a reflowing furnace (not shown), the wiring structure as shown in FIG. 1 between the lead frame 2 and the power semiconductor element 5 can be obtained.

By the construction of the power semiconductor device of the first embodiment, a layer with a low coefficient of linear expansion and a low modulus of elasticity lies between the power semiconductor element 5 and the lead frame 2. Therefore, even when the power semiconductor element 5 heats, the lead frame 2 expands greatly and a distortion occurs in the porous nickel plating 1, the heat stress induced on the solder layer 4 is eased since the modulus of elasticity of the porous nickel plating 1 is low.

A heat warp is induced on the solder layer 4 by the difference of the coefficients of linear expansion of the porous nickel plating 1 and the power semiconductor element 5, but the difference is small, and the heat stress to the solder layer 4 is reduced compared with the case where the porous nickel plating 1 does not intervene.

Since the heat stress to the junction can be reduced by only jointing the lead frame 2, to which the porous nickel plating 1 is applied, to the power semiconductor element 5 by solder, the solder layer 4 required for junction can be only one layer. Thereby, compared with a simple solder junction, an increased part of the thermal resistance of the solder junction of the first embodiment can be held down only to that of the part of the porous nickel plating 1.

Figure 4:
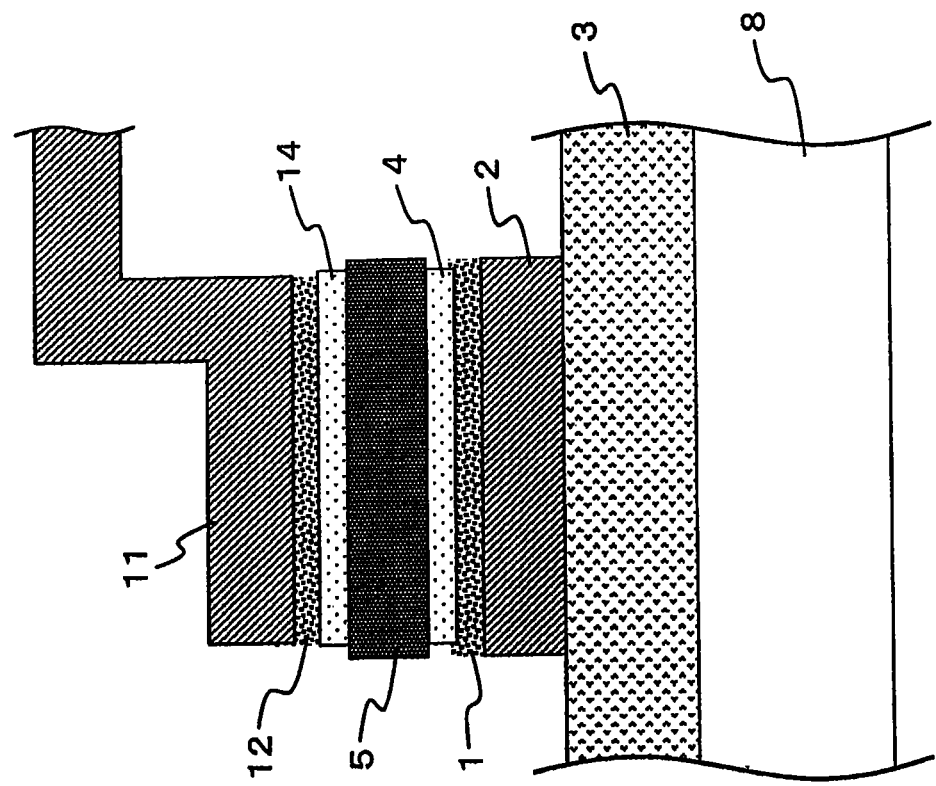
FIG. 4 is a schematic sectional view showing an arrangement of a power semiconductor device of another composition according to the first embodiment of the present invention.

FIG. 4 shows a schematic sectional view showing an arrangement of a power semiconductor device of another composition according to the first embodiment. In FIG. 4, the components that are the same as those in FIG. 1 are denoted by the same reference numerals.

In the power semiconductor device shown in FIG. 4, lead frames are jointed to both sides of the power semiconductor element 5 by solder, respectively. One surface of the power semiconductor element 5 is jointed to a lead frame 2, to which a porous nickel plating 1 is applied, through a solder layer 4. The opposite surface of the power semiconductor element 5 is jointed to a second lead frame 11, to which a second porous nickel plating 12 is applied, through a second solder layer 14.

One end of the second lead frame 11, to which the second porous nickel plating 12 is applied, is jointed to the power semiconductor element 5 by solder, and another end of the second lead frame 11 is connected to a second power semiconductor element or a third lead frame (not shown).

Even in the arrangement in which two or more lead frames 2 and 11 are jointed to the power semiconductor element 5 by solder as shown in FIG. 4, the same effect as an effect of reducing heat stress of the arrangement shown in FIG. 1 can be obtained at the solder layer 4 and the second solder layer 14.

The second solder layer 14 in FIG. 4 corresponds to an example of another solder layer according to the present invention. The second porous nickel plating 12 corresponds to an example of another porous nickel plating part according to the present invention. The second lead frame 11 corresponds to an example of another lead frame according to the present invention.

As mentioned above, by using the arrangement of the power semiconductor device of the first embodiment, a heat stress to the solder layer 4 can be reduced and an occurrence of the solder crack can be suppressed, with suppressing an increase of thermal resistance of the junction.

In the above, the power semiconductor device having the power semiconductor element is described as an example, but the composition of the first embodiment can be applied in a semiconductor device in which a semiconductor element other than a power semiconductor element is jointed to a lead frame directly, and the same effect can be obtained.

Next, the effect of the present invention is described by comparing examples of the first embodiment with comparative examples.

The examples of the first embodiment are described below by using a simulation, but the present invention is not limited to the examples.

When the simulation is performed, the same values common to the examples 1 to 7, comparative example 1 and the comparative example 2 are used for all of a size, material physical property value and the like of a constructional element other than a porous nickel plating layer.

Figure 5:
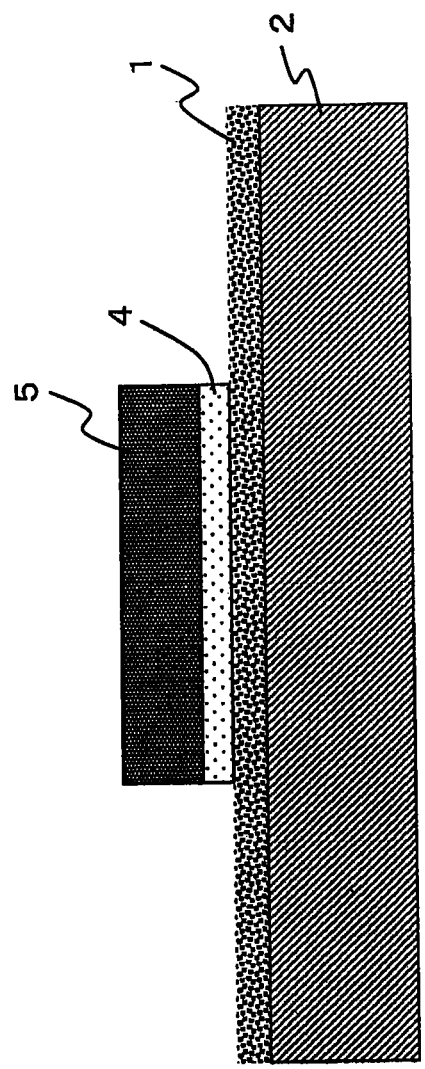
FIG. 5 is a schematic sectional view showing an arrangement of power semiconductor devices in examples 1 to 6 and compatible examples 1 and 2 according to the first embodiment of the present invention.

FIG. 5 shows a schematic sectional view showing an arrangement of power semiconductor devices in the examples 1 to 7 of the first embodiment and the compatible examples 1 and 2.

In the examples 1 to 6 and the compatible examples 1 and 2, when the plating is applied to the lead frame 2, the plating is applied to only one surface which is on a side to be jointed to the power semiconductor element 5 by using the mask 13 shown in FIG. 2(A). In the example 7, the plating is applied to the whole surface of the lead frame 2 by not using the mask 13.

Example 1

In the power semiconductor device in the example 1, as shown in FIG. 5, the power semiconductor element 5 having a length of 4 mm, a width of 6 mm and a thickness of 0.4 mm (a modulus of elasticity of 450 GPa and a coefficient of linear expansion of 4.2 ppm), and the lead frame 2 having a length of 10 mm, a width of 10 mm and a thickness of 1.5 mm (Cu, a modulus of elasticity of 120 GPa and a coefficient of linear expansion of 16.6 ppm) to which the porous nickel plating 1 having a thickness of 10 μm and a porosity of 20% (a modulus of elasticity of 168 GPa, a coefficient of linear expansion of 10.2 ppm and a thermal conductivity of 72.8 W/(m·K)) has been applied are jointed by the solder layer 4 having a length of 4 mm, a width of 6 mm and a thickness of 100 μm (Sn—Ag—Cu, a modulus of elasticity of 41.6 GPa, a coefficient of linear expansion of 21.7 ppm and a thermal conductivity of 55 W/(m·K)).

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C.

The modulus of elasticity, the coefficient of linear expansion, and the thermal conductivity of the porous nickel plating 1 are calculated by multiplying the modulus of elasticity (210 GPa), the coefficient of linear expansion (12.8 ppm), and the thermal conductivity (91 W/(m·K)) of nickel, respectively, by (100−porosity) %. The moduli of elasticity and the coefficients of linear expansion of the porous nickel plating in the examples 2 to 7 are defined similarly.

The total of the thermal resistance of the porous nickel plating 1 and the thermal resistance of the solder layer 4 is calculated as a value of a thermal resistance of the junction. The values of the thermal resistance of the junction in the examples 2 to 6 are calculated similarly.

Example 2

In the power semiconductor device in the example 2, the thickness and the porosity of the porous nickel plating 1 are 10 μm and 60% (a modulus of elasticity of 84 GPa, a coefficient of linear expansion of 5.1 ppm and a thermal conductivity of 36.4 W/(m·K)), respectively, in the composition of the example 1.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 1.

Example 3

In the power semiconductor device in the example 3, the thickness and the porosity of the porous nickel plating 1 are 20 μm and 20% (a modulus of elasticity of 168 GPa, a coefficient of linear expansion of 10.2 ppm and a thermal conductivity of 72.8 W/(m·K)), respectively, in the composition of the example 1.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 1.

Example 4

In the power semiconductor device in the example 4, the thickness and the porosity of the porous nickel plating 1 are 20 μm and 60% (a modulus of elasticity of 84 GPa, a coefficient of linear expansion of 5.1 ppm and a thermal conductivity of 36.4 W/(m·K)), respectively, in the composition of the example 1.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 1.

Example 5

In the power semiconductor device in the example 5, the thickness and the porosity of the porous nickel plating 1 are 100 μm and 20% (a modulus of elasticity of 168 GPa, a coefficient of linear expansion of 10.2 ppm and a thermal conductivity of 72.8 W/(m·K)), respectively, in the composition of the example 1.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 1.

Example 6

In the power semiconductor device in the example 6, the thickness and the porosity of the porous nickel plating 1 are 100 μm and 60% (a modulus of elasticity of 84 GPa, a coefficient of linear expansion of 5.1 ppm and a thermal conductivity of 36.4 W/(m·K)), respectively, in the composition of the example 1.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 1.

Example 7

In the power semiconductor device in the example 7, the porous nickel plating 1 having a thickness of 10 μm and a porosity of 20% is applied to not only the side surface which is jointed to the power semiconductor element 5 but also the whole surface of the lead frame 2, in the composition of the example 1. Therefore, in FIG. 5, the porous nickel plating 1 has been applied to not only the upper surface but also the undersurface of the lead frame 2.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 1.

Since the undersurface of the lead frame 2 is not fixed, the thermal resistance is the same value as that of the example 1 in which the porous nickel plating 1 is applied to only the upper surface.

About thermal resistance, a value of a thermal resistance (the total value of the thermal resistance of the porous nickel plating 1 and the thermal resistance of the solder layer 4) on the side of the upper surface of the lead frame 2 and a value of a thermal resistance (the thermal resistance of the porous nickel plating 1 on the side of the undersurface) on the side of the undersurface are calculated individually, and the value of the thermal resistance on the side of the upper surface is calculated as a value of a thermal resistance of the junction.

Comparative Example 1

In the power semiconductor device in the comparative example 1, the power semiconductor element 5 and the lead frame 2 are jointed by solder by applying a nickel plating of 4 μm instead of the porous nickel plating to the lead frame 2, in the composition of the example 1.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 1.

The thermal resistance of the solder layer 4 is calculated as a value of a thermal resistance of the junction.

Comparative Example 2

In the power semiconductor device in the comparative example 2, the thickness and the porosity of the porous nickel plating 1 are 200 μm and 60% (a modulus of elasticity of 84 GPa, a coefficient of linear expansion of 5.1 ppm and a thermal conductivity of 36.4 W/(m·K)), respectively, in the composition of the example 1.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 1.

The total of the thermal resistance of the porous nickel plating 1 and the thermal resistance of the solder layer 4 is calculated as a value of a thermal resistance of the junction.

(Evaluation)

TABLE 1 shows maximum heat stresses and values of the thermal resistance of the junction, which are applied to respective solder layers 4 in the examples 1 to 7 and the compatible examples 1 and 2.

TABLE 1

| | Porous Nickel plating | | Maximum heat stresses applied | Thermal resistance |
|---|---|---|---|---|
| | Thickness (μm) | Porosity (%) | solder layer (Mpa) | of junction (K/W) |
| Comparative example 1 | — | — | 1048 | 0.078 |
| Example 1 | 10 | 20 | 1011 | 0.081 |
| Example 2 | 10 | 60 | 991 | 0.087 |
| Example 3 | 20 | 20 | 953 | 0.087 |
| Example 4 | 20 | 60 | 914 | 0.099 |
| Example 5 | 100 | 20 | 581 | 0.133 |
| Example 6 | 100 | 60 | 527 | 0.191 |
| Example 7 | Upper surface 10, Undersurface 10 | 20 | 1011 | 0.081 + 0.006 |
| Comparative example 2 | 200 | 60 | 420 | 0.306 |

As shown in TABLE 1, the heat stress applied to the solder layer 4 is reduced about 4% or more and 50% or less in the examples 1 to 7, compared with the comparative example 1. The value of the thermal resistance is held down so as to be 1.1 to 2.5 times as large as that of the comparative example 1.

An extent of a value of the thermal resistance suitable for a junction of a power semiconductor changes with the area size of the joint surface of the power semiconductor element 5. As the value of the thermal resistance of the junction of the power semiconductor in the case of the power semiconductor element 5 (having a length of 4 mm and a width of 6 mm) and the lead frame 2 which are used in this simulation, 0.2K/W or less per joint surface is desirable, and 0.15K/W or less per joint surface is more desirable.

In the comparative example 2, although the thermal stress is 420 Mpa and small enough, the value of the thermal resistance is 0.306K/W and a large value, it is not suitable for the junction of the power semiconductor.

As shown in the example 7, the value of the thermal resistance in the joint surface of the power semiconductor element 5 is the same as that in the case where the porous nickel plating 1 is applied only to the upper surface of the lead frame 2 (the example 1). Therefore, when the porous nickel plating 1 of the same thickness in the examples 2 to 6 is applied on the whole surface of the lead frame 2, the values of the thermal resistance to be obtained are the same values in the examples 2 to 6, respectively.

In the examples 1 and 2 in which the thickness of the porous nickel plating 1 is 10 μm, the reduction of the heat stress is 5% or less compared with the comparative example 1. On the other hand, in the examples 3 to 6 in which the thickness of the porous nickel plating 1 is 20 μm or more, the reduction of the heat stress is 10% or more compared with the comparative example 1, and more effective stress reduction has been confirmed.

Second Embodiment

FIG. 6(A) is a schematic sectional view showing an arrangement of a power semiconductor device according to a second embodiment of the present invention.

In FIGS. 6 to 10 used with the second embodiment, the components that are the same as those in FIGS. 1 to 5 used with the first embodiment are denoted by the same reference numerals.

A surface of one side of a lead frame 2 is fixed on an insulator 3 an undersurface of which is arranged with contact on a heat radiation plate 8. Another surface of the lead frame 2, to which a porous nickel plating 20 is applied, is jointed to a power semiconductor element 5 through a solder layer 4.

FIG. 6(B) shows an expanded sectional view of a part of the porous nickel plating 20 which is surrounded by the circle-shaped dashed line in FIG. 6(A).

As shown in FIG. 6(B), nanoparticles 17 with high thermal conductivity are embedded into pores 7 which are located at a surface of junction side of the porous nickel plating 20 to the solder layer 4.

In the second embodiment, the nanoparticles 17 are embedded into the pores 7 of the porous nickel plating 20, and it differs in this respect from the first embodiment in which the nanoparticle 17 is not embedded into the pore 7 for the porous nickel plating 1.

The nanoparticles 17 correspond to an example of particles having a thermal conductivity, which is higher than that of nickel, are embedded into the pores which are located at a junction part to the solder layer according to the present invention.

For example, the arrangement of the power semiconductor is manufactured by the processes of FIGS. 7(A) to 7(D).

FIGS. 7(A) to 7(D) are process drawings of examples of a manufacturing process of the power semiconductor device of the second embodiment. FIG. 7(A) shows a plating step, FIG. 7(B) shows a particle embedding step in which the nanoparticles 17 are embedded into the pores 7 located in the surface of the porous nickel plating 20, FIG. 7(C) shows a lead frame fixing step and FIG. 7(D) shows a solder junction step.

First, as shown in FIG. 7(A), the porous nickel plating 20 is applied on the lead frame 2.

For example, the porous nickel plating 20 is obtained by soaking the lead frame 2 in a nickel plating tank 6 in which the foaming agent is put, and applying electroplating to it. In FIG. 7(A), a mask 13 is attached to the lead frame 2, and the porous plating 20 is applied selectively to only the side surface which is jointed to the power semiconductor element 5 by solder. At this time, a thickness and a porosity of the porous nickel plating 20 are controllable by adjusting an electric current density passed to the lead frame 2, and a plating time.

FIG. 8(A) shows a schematic sectional view of the porous nickel plating 20 which is applied on the surface of the lead frame 2 after the plating step in FIG. 7(A) is performed.

The pore 7 of the porous nickel plating is 10 µm or more and 15 µm or less in height and needlelike. As the porosity becomes large, a diameter of the pore 7 becomes larger.

The porous nickel plating 20 is not limited to be applied selectively to only the part which is jointed to the power semiconductor element 5 by solder as shown in FIG. 7(A) but can be applied on the whole of the surface of the lead frame 2. However, it is more desirable to apply the porous nickel plating 20 only to the part which is jointed by the solder selectively, in order to suppress the increase in thermal resistance of the part which is not jointed to the power semiconductor element 5.

When a coefficient of linear expansion of the porous nickel plating 20 is smaller than the coefficient of linear expansion of the lead frame 2, and larger than the coefficient of linear expansion of the semiconductor element 5, the heat stress applied to the solder layer 4 can be reduced effectively. It is thought that the coefficient of linear expansion of the porous nickel plating 20 is equivalent to the value obtained by multiplying a coefficient (12.8 ppm) of linear expansion of nickel by (100−porosity) %. Since the coefficient of linear expansion of the power semiconductor element 5 is about 4 ppm or more and 5 ppm or less, the porosity of the porous nickel plating 20 needs to be 60% or less.

When the porosity of the porous nickel plating 20 is smaller than 20%, a deviation occurs in the number of pores per unit volume, and the porous nickel plating layer of uniform porosity cannot be obtained.

As mentioned above, it is desirable that the porosity of the porous nickel plating 20 is 20% or more and 60% or less.

Further, the pore 7 of the porous nickel plating 20 is 10 µm or more and 15 µm or less in height and needlelike. Therefore when the thickness of the porous nickel plating 20 is smaller than 10 µm, plating thickness varies and a uniform porous nickel plating layer cannot be obtained. And, in the second embodiment, when the thickness is larger than 200 µm, the thermal resistance of the porous nickel plating layer increases, and a productivity worsens because the plating time becomes still longer.

Thereby, in the second embodiment, it is desirable that the thickness of the porous nickel plating 20 is 10 µm or more and 200 µm or less. When the porous nickel plating 20 has a certain amount of thickness, a distortion induced on the solder layer 4 decreases and a heat stress is eased. It is more desirable that the thickness of the porous nickel plating 20 is 20 µm or more and 200 µm or less, so that the stress reduction to the solder layer 4 is more effective.

Though copper or aluminum is desirable as a material of the lead frame 2, the copper which has large electric conductivity and large thermal conductivity is more desirable.

The porous nickel plating 20 is applied to the lead frame 2 directly in the above, but the porous nickel plating 20 can be applied to the lead frame 2 to which another surface treatment has been applied in advance.

Next, as shown in FIG. 7(B), the nanoparticles 17 are embedded into the pores 7 located in the surface of the porous nickel plating 20 applied to the lead frame 2.

As a method of embedding the nanoparticles 17 into the surface of the porous nickel plating 20, for example, there is a method of soaking the lead frame 2 in an ultrasonic cleaning tank 15 in which the solution 16, in which the nanoparticles 17 are distributed uniformly, is put, and applying an ultrasonic vibration. As the solution 16 in which the nanoparticles 17 are distributed uniformly, for example, aqueous solution of ethanol or the like with small surface tension can be used. The nanoparticles 17 can be led into the pores 7 of the surface of the porous nickel plating 20 with uniform density, by adjusting a concentration of the mixed solution 16 in which the nanoparticles 17 are dispersed and a time for applying the ultrasonic vibration.

In the lead frame 2 in which the nanoparticles 17 are inserted into the surface of the porous nickel plating 20, for example, a solvent is evaporated by decompression or slight heating.

FIG. 8(B) shows a schematic sectional view of the porous nickel plating 20 which is applied on the surface of the lead frame 2 after the particle embedding step in FIG. 7(B) is performed.

The porous nickel plating 20 which is applied on the surface of the lead frame 2 corresponds to an example of a porous nickel plating part according to the present invention.

When the thermal conductivity of the nanoparticle 17 is not higher than the thermal conductivity (about 90.5 W/(m·K)) of nickel, it cannot reduce the thermal resistance of the junction effectively. Thereby, a material of the nanoparticle 17 is desirable such that a thermal conductivity is more than 91 W/(m·K). Although carbon materials (e.g. diamond, carbon nanotube and graphite) are desirable as the material of the nanoparticle 17, diamond (about 2000 W/(m·K)) is more desirable among the carbon materials.

When the nanoparticles 17 of small size are embedded into the pore 7 of the surface of the porous nickel plating 20, a contact area between particles, and a contact area between a particle and the porous nickel plating 20 become large, and the thermal resistance can be reduced more. Thereby, it is desirable that a size of the nanoparticle 17 is 50 nm or less. When the size is larger than 50 nm, the contact area with the porous nickel plating 20 becomes small, and it becomes impossible to conduct heat efficiently.

However, when the nanoparticle 17 is smaller than 4 nm, a control by ultrasonic vibration is difficult since the diffused nanoparticle is very light, and the nanoparticles 17 cannot go into the pores 7 of the porous nickel plating 20 easily. Therefore, it is desirable that the nanoparticle 17 is larger than 4 nm.

Since the nanoparticles 17 are contained in the pores 7 of the surface of the porous nickel plating 20 with fixed density in the state of particle, they do not influence the stress relaxation effect of the porous nickel plating 20. Therefore, the modulus of elasticity and the coefficient of linear expansion of the porous nickel plating 20 in which the nanoparticles 17 are embedded into the pores 7 of the surface are equivalent to those of a porous nickel plating in which the nanoparticle 17 is not added, respectively.

Since the nanoparticles 17 with high thermal conductivity are compacted and contained with fixed density in the pores 7 of the surface of the porous nickel plating 20, the heat from the porous nickel plating 20 can escape quickly with a sufficient contact area to the porous nickel plating 20.

Next, as shown in FIG. 7(C), the porous nickel plating 20 is applied to the lead frame 2, and the lead frame 2 in which the nanoparticles 17 are embedded into the surface of the porous nickel plating 20 is fixed on an insulating resin 9. Here, the insulating resin 9 is used as the insulator 3.

The lead frame 2, to which the porous nickel plating 20 is applied in which the nanoparticles 17 are embedded into the surface, is placed on the insulating resin 9 expanded on the heat radiation plate 8 so that the lead frame 2 does not come into contact with the heat radiation plate 8 and one surface of the lead frame 2 is exposed on the insulating resin 9, and the lead frame 2 is fixed on the insulating resin 9 by curing the insulating resin 9.

Next, as shown in FIG. 7(D), a cream solder 10 is screen-printed to the exposed surface of the lead frame 2, the power semiconductor element 5 is placed on that, and the arrangement of the present invention is constructed. A suitable cream solder is selected as the cream solder 10, according to the environment in which the power semiconductor device having the arrangement of the present invention is used.

When the cream solder 10 is printed to the power semiconductor element 5, the cream solder 10 is supplied so that a thickness of the cream solder 10 becomes 50 μm or more and 100 μm or less. When the thickness of the solder layer is 50 μm or less, the junction intensity between the power semiconductor element 5 and the porous nickel plating 20 declines. And when the thickness is 100 μm or more, the thermal resistance increases. Therefore, the cream solder 10 is supplied so that the thickness of the solder layer becomes 50 μm or more and 100 μm or less.

Next, when this structure is passed through a reflowing furnace (not shown), the wiring structure as shown in FIG. 6(A) between the lead frame 2 and the power semiconductor element 5 can be obtained.

By the construction of the power semiconductor device of the second embodiment, a layer with a low coefficient of linear expansion and a low modulus of elasticity lies between the power semiconductor element 5 and the lead frame 2. Therefore, even when the power semiconductor element 5 heats, the lead frame 2 expands greatly and a distortion occurs in the porous nickel plating 20 in which the nanoparticles 17 are embedded, the heat stress induced on the solder layer 4 is eased since the modulus of elasticity is low.

A heat warp is induced on the solder layer 4 by the difference of the coefficients of linear expansion of the porous nickel plating 20 in which the nanoparticles 17 are embedded and the power semiconductor element 5, but the difference is small, and the heat stress to the solder layer 4 is reduced compared with the case where the porous nickel plating 20 in which the nanoparticle 17 are embedded does not intervene.

Since the heat stress to the junction can be reduced by only jointing the lead frame 2, to which the porous nickel plating 20 is applied in which the nanoparticles 17 are embedded into the pores 7 of the surface, to the power semiconductor element 5 by solder, the solder layer 4 required for junction can be only one layer. Thereby, compared with a simple solder junction, an increased part of the thermal resistance of the solder junction of the second embodiment can be held down only to that of the part of the porous nickel plating 20. Furthermore, since the nanoparticles 17 with high thermal conductivity are embedded into the pores 7 of the surface of the porous nickel plating 20, the increased part of the thermal resistance by the porous nickel plating 20 can be suppressed to be still smaller.

Figure 6:
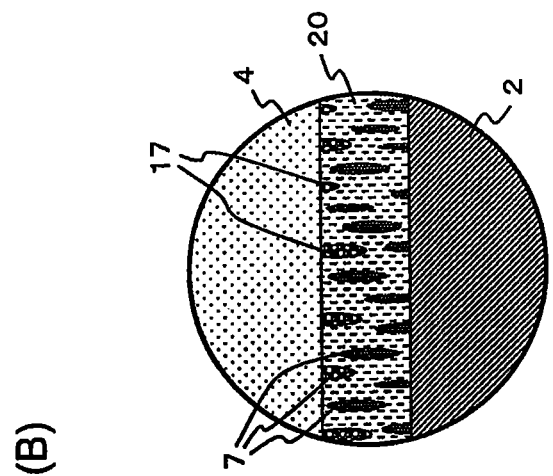
FIG. 6(A) is a schematic sectional view showing an arrangement of a power semiconductor device according to a second embodiment of the present invention.
FIG. 6(B) is an expanded sectional view of a porous nickel plating part of the power semiconductor device according to the second embodiment of the present invention.
Figure 6:
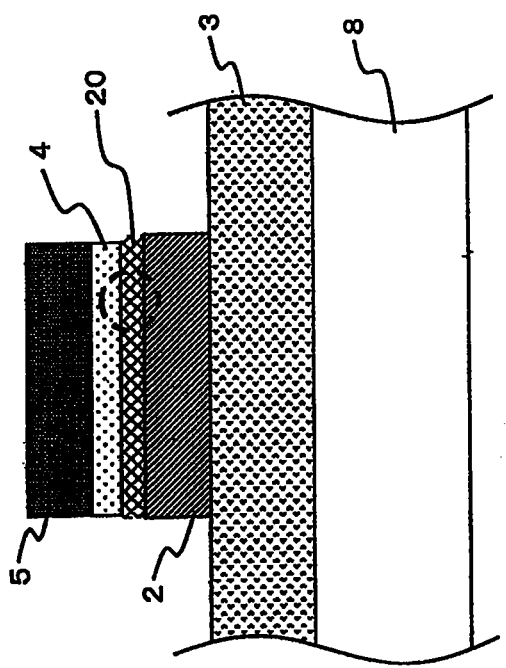
Figure 7:
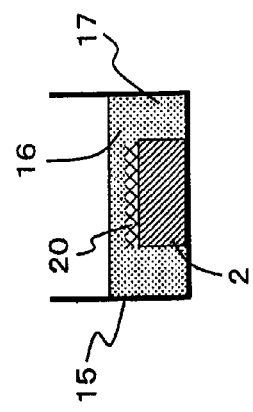
FIG. 7(A) is a diagram showing a plating step in a manufacturing process of the power semiconductor device according to the second embodiment of the present invention.
FIG. 7(B) is a diagram showing a particle embedding step, in which a nanoparticle is embedded into a pore located in a surface of the porous nickel plating, in the manufacturing process of the power semiconductor device according to the second embodiment of the present invention.
FIG. 7(C) is a diagram showing a lead frame fixing step in the manufacturing process of the power semiconductor device according to the second embodiment of the present invention.
FIG. 7(D) is a diagram showing a solder junction step in the manufacturing process of the power semiconductor device according to the second embodiment of the present invention.
Figure 7:
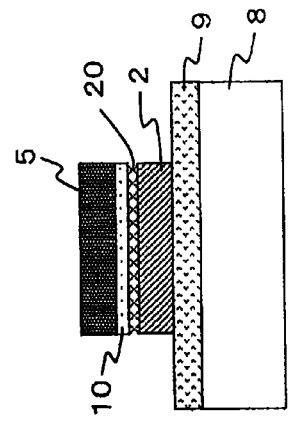
Figure 7:
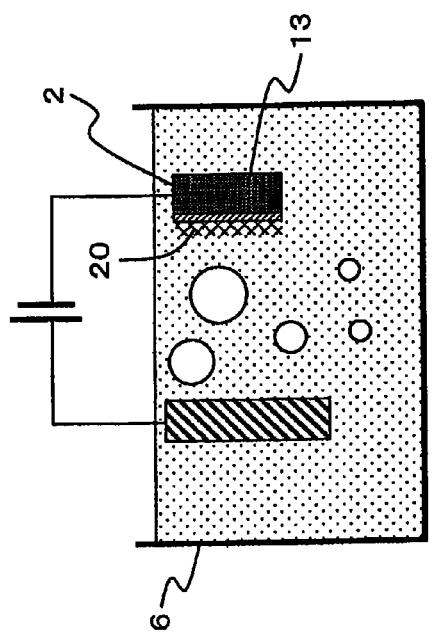
Figure 7:
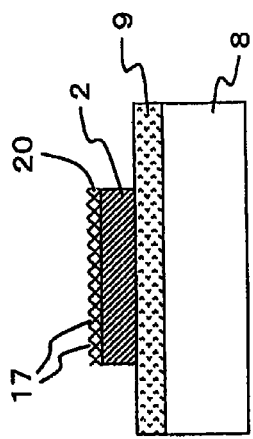
Figure 9:
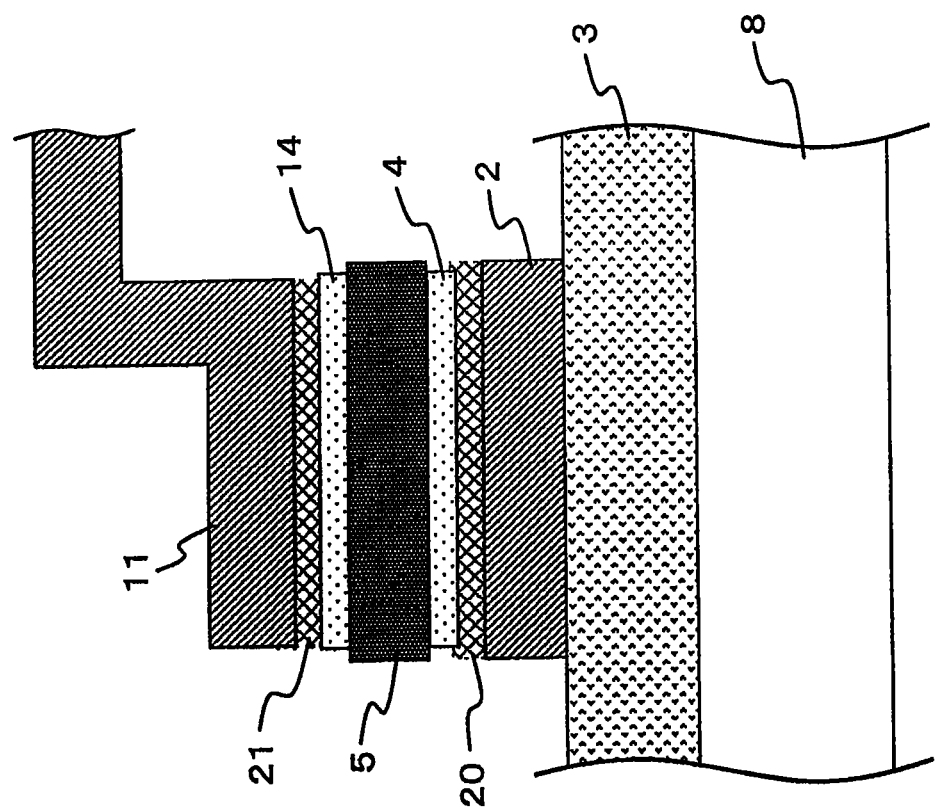
FIG. 9 is a schematic sectional view showing an arrangement of a power semiconductor device of another composition according to the second embodiment of the present invention.

FIG. 9 shows a schematic sectional view showing an arrangement of a power semiconductor device of another composition according to the second embodiment. In FIG. 9, the components that are the same as those in FIG. 6 are denoted by the same reference numerals.

In the power semiconductor device shown in FIG. 9, lead frames are jointed to both sides of the power semiconductor element 5 by solder, respectively. One surface of the power semiconductor element 5 is jointed to a lead frame 2, to which a porous nickel plating 20 is applied, through a solder layer 4. The opposite surface of the power semiconductor element 5 is jointed to a second lead frame 11, to which a second porous nickel plating 21 is applied, through a second solder layer 14.

As shown in FIG. 6(B), the nanoparticles 17 are embedded into the pores 7 which are located at the surface of junction side of the porous nickel plating 20 to the solder layer 4. Similarly, the nanoparticles 17 are embedded also into the pores which are located at the surface of junction side of the second porous nickel plating 21 to the second solder layer 14.

One end of the second lead frame 11, to which the second porous nickel plating 21 is applied in which the nanoparticles are embedded into the surface, is jointed to the power semiconductor element 5 by solder, and another end of the second lead frame 11 is connected to a second power semiconductor element or a third lead frame (not shown).

Even in the arrangement in which two or more lead frames 2 and 11 are jointed to the power semiconductor element 5 by solder as shown in FIG. 9, the same effect as an effect of reducing heat stress of the arrangement shown in FIG. 6(A) can be obtained at the solder layer 4 and the second solder layer 14.

The second solder layer 14 in FIG. 9 corresponds to an example of another solder layer according to the present invention. The second porous nickel plating in which the nanoparticles are embedded into the pores at the surface corresponds to an example of another porous nickel plating part having many pores according to the present invention.

The second lead frame 11 corresponds to an example of another lead frame according to the present invention.

As mentioned above, by using the arrangement of the power semiconductor device of the second embodiment, a heat stress to the solder layer 4 can be reduced and an occurrence of the solder crack can be suppressed, with suppressing an increase of thermal resistance of the junction.

In the above, the power semiconductor device having the power semiconductor element is described as an example, but the composition of the second embodiment can be applied in a semiconductor device in which a semiconductor element other than a power semiconductor element is jointed to a lead frame directly, and the same effect can be obtained.

Next, the effect of the present invention is described by comparing examples of the second embodiment with comparative examples.

The examples of the second embodiment are described below by using a simulation, but the present invention is not limited to the examples.

When the simulation is performed, the same values common to the examples 8 to 13, comparative example 1 and the comparative example 3 are used for all of a size, material physical property value and the like of a constructional element other than a porous nickel plating layer.

Figure 10:
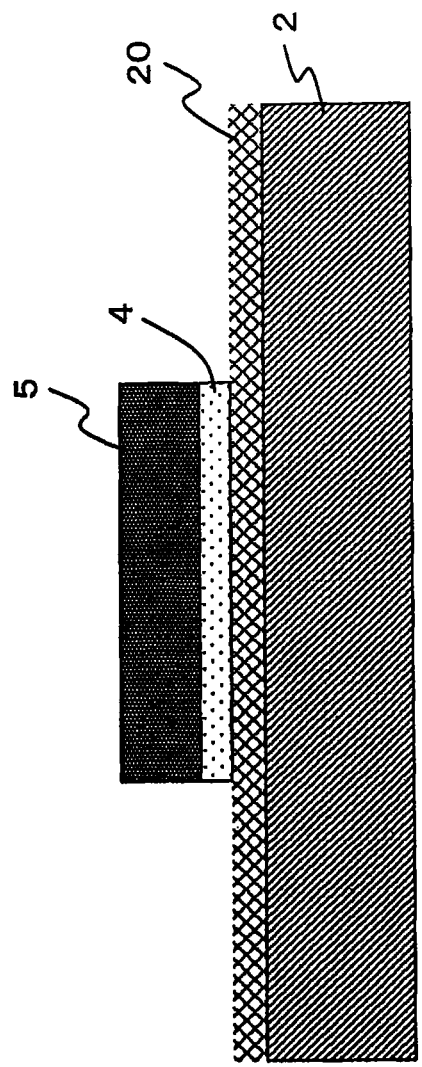
FIG. 10 is a schematic sectional view showing an arrangement of power semiconductor devices in examples 8 to 13 and compatible examples 1 and 3 according to the second embodiment of the present invention.
Figure 11:
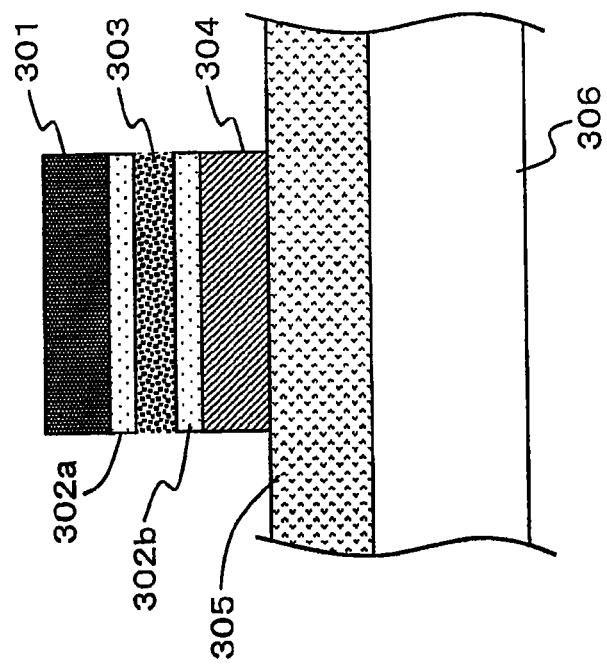
FIG. 11(A) is a schematic sectional view showing an junction part between a power semiconductor element and a lead frame in a conventional power semiconductor device.
FIG. 11(B) is a schematic sectional view showing an junction part between a power semiconductor element and a lead frame when a heat-conducting porous metal plate is arranged on the conventional power semiconductor device.
Figure 11:
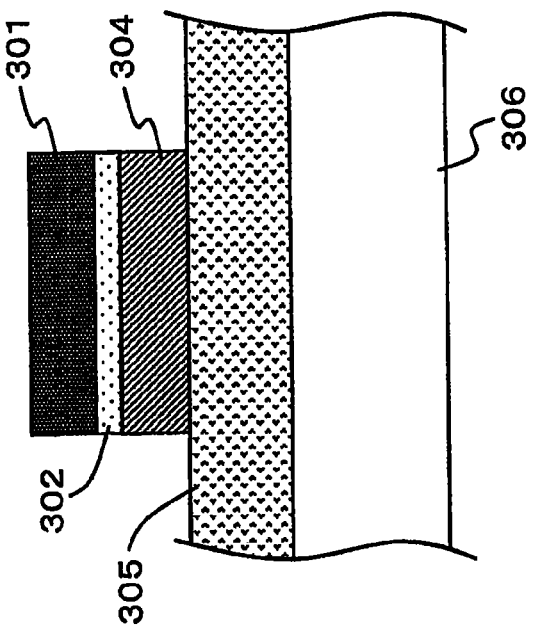

FIG. 10 shows a schematic sectional view showing an arrangement of power semiconductor devices in the examples 8 to 13 of the second embodiment and the compatible examples 1 and 3.

In the examples 8 to 13 and the compatible examples 1 and 3, when the plating is applied to the lead frame 2, the plating is applied to only one surface which is on a side to be jointed to the power semiconductor element 5 by using the mask 13 shown in FIG. 7(A).

Example 8

In the power semiconductor device in the example 8, as shown in FIG. 10, the power semiconductor element 5 having a length of 4 mm, a width of 6 mm and a thickness of 0.4 mm (a modulus of elasticity of 450 GPa and a coefficient of linear expansion of 4.2 ppm), and the lead frame 2 having a length of 10 mm, a width of 10 mm and a thickness of 1.5 mm (Cu, a modulus of elasticity of 120 GPa and a coefficient of linear expansion of 16.6 ppm) to which the porous nickel plating 20 having a thickness of 20 μm and a porosity of 20% (a modulus of elasticity of 168 GPa, a coefficient of linear expansion of 10.2 ppm and a thermal conductivity of 172.8 W/(m·K)) has been applied are jointed by the solder layer 4 having a length of 4 mm, a width of 6 mm and a thickness of 100 μm (Sn—Ag—Cu a modulus of elasticity of 41.6 GPa, a coefficient of linear expansion of 21.7 ppm and a thermal conductivity of 55 W/(m·K)). The nanoparticles 17 (nanodiamonds having a thermal conductivity of 2000 W/(m·K)) are embedded into the pores 7 of the surface of the porous nickel plating 20, and a thickness of the porous nickel plating 20 is 5 μm.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C.

The modulus of elasticity, and the coefficient of linear expansion of the porous nickel plating 20 in which the nanoparticles 17 are embedded into the surface are calculated by multiplying the modulus of elasticity (210 GPa), and the coefficient of linear expansion (12.8 ppm) of nickel, respectively, by (100−porosity) %. The moduli of elasticity and the coefficients of linear expansion of the porous nickel plating in the examples 9 to 13 are defined similarly.

The thermal conductivity of the porous nickel plating 20 in which the nanoparticles 17 are embedded into the pores 7 of the surface is calculated by adding the value calculated by multiplying the thermal conductivity (91 W/(m·K)) of nickel by (100−porosity) % and the value calculated by multiplying the thermal conductivity (2000 W/(m·K)) of the nanodiamonds by ((thickness of nanoparticle/thickness of porous nickel plating)×porosity) %. The thermal conductivity of the porous nickel plating in the examples 9 to 13 are defined similarly.

The total of the thermal resistance of the porous nickel plating 20, in which the nanodiamonds are embedded into the pores of the surface, and the thermal resistance of the solder layer 4 is calculated as a value of a thermal resistance of the junction. The values of the thermal resistance of the junction in the examples 9 to 13 are calculated similarly.

Example 9

In the power semiconductor device in the example 9, the thickness and the porosity of the porous nickel plating 20 are 20 μm and 60% (a modulus of elasticity of 84 GPa, a coefficient of linear expansion of 5.1 ppm and a thermal conductivity of 336.4 W/(m·K)), respectively, in the composition of the example 8. The nanoparticles 17 (nanodiamonds having a thermal conductivity of 2000 W/(m·K)) are embedded into the pores 7 of the surface of the porous nickel plating 20, and a thickness of the porous nickel plating 20 is 5 μm.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 8.

Example 10

In the power semiconductor device in the example 10, the thickness and the porosity of the porous nickel plating 20 are 100 μm and 20% (a modulus of elasticity of 168 GPa, a coefficient of linear expansion of 10.2 ppm and a thermal conductivity of 92.8 W/(m·K)), respectively, in the composition of the example 8. The nanoparticles 17 (nanodiamonds having a thermal conductivity of 2000 W/(m·K)) are embedded into the pores 7 of the surface of the porous nickel plating 20, and a thickness of the porous nickel plating 20 is 5 μm.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 8.

Example 11

In the power semiconductor device in the example 11, the thickness and the porosity of the porous nickel plating 20 are 100 μm and 60% (a modulus of elasticity of 84 GPa, a coefficient of linear expansion of 5.1 ppm and a thermal conductivity of 96.4 W/(m·K)), respectively, in the composition of the example 8. The nanoparticles 17 (nanodiamonds having a thermal conductivity of 2000 W/(m·K)) are embedded into the pores 7 of the surface of the porous nickel plating 20, and a thickness of the porous nickel plating 20 is 5 μm.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 8.

Example 12

In the power semiconductor device in the example 12, the thickness and the porosity of the porous nickel plating 20 are 200 μm and 20% (a modulus of elasticity of 168 GPa, a coefficient of linear expansion of 10.2 ppm and a thermal conductivity of 82.8 W/(m·K)), respectively, in the composition of the example 8. The nanoparticles 17 (nanodiamonds having a thermal conductivity of 2000 W/(m·K)) are embedded into the pores 7 of the surface of the porous nickel plating 20, and a thickness of the porous nickel plating 20 is 5 μm.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 8.

Example 13

In the power semiconductor device in the example 13, the thickness and the porosity of the porous nickel plating 20 are 200 μm and 60% (a modulus of elasticity of 84 GPa, a coefficient of linear expansion of 5.1 ppm and a thermal conductivity of 66.4 W/(m·K)), respectively, in the composition of the example 8. The nanoparticles 17 (nanodiamonds having a thermal conductivity of 2000 W/(m·K)) are embedded into the pores 7 of the surface of the porous nickel plating 20, and a thickness of the porous nickel plating 20 is 5 μm.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 8.

Comparative Example 1

In the power semiconductor device in the comparative example 1, the power semiconductor element 5 and the lead frame 2 are jointed by solder by applying a nickel plating of 4 μm instead of the porous nickel plating 20, in which the nanodiamonds are embedded into the pores of the surface, to the lead frame 2, in the composition of the example 8. The composition of this comparative example 1 is the same composition of the comparative example 1 used as a comparative example in the first embodiment.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 8.

The thermal resistance of the solder layer 4 is calculated as a value of a thermal resistance of the junction.

Comparative Example 3

In the power semiconductor device in the comparative example 3, the thickness and the porosity of the porous nickel plating 20 are 300 μm and 60% (a modulus of elasticity of 84 GPa, a coefficient of linear expansion of 5.1 ppm and a thermal conductivity of 56.4 W/(m·K)), respectively, in the composition of the example 8. The nanoparticles 17 (nanodiamonds having a thermal conductivity of 2000 W/(m·K)) are embedded into the pores 7 of the surface of the porous nickel plating 20, and a thickness of the porous nickel plating 20 is 5 μm.

In the wiring structure between the power semiconductor element 5 of the power semiconductor device and the lead frame 2, the heat stress applied to the solder layer 4 is calculated by using the linear structural analysis (FEM) when a temperature of constructional elements is changed from 200° C. to −40° C. The other compositions are the same as those of the example 8.

The total of the thermal resistance of the porous nickel plating 20, in which the nanodiamonds are embedded into the pores of the surface, and the thermal resistance of the solder layer 4 is calculated as a value of a thermal resistance of the junction.

(Evaluation)

TABLE 2 shows maximum heat stresses and values of the thermal resistance of the junction, which are applied to respective solder layers 4 in the examples 8 to 13 and the compatible examples 1 and 3.

For reference, the values of the thermal resistance of the porous nickel plating 20 in which the nanodiamonds are not embedded are also indicated in TABLE 2 for the examples 8 to 11 and 13.

TABLE 2

| | Porous Nickel plating | | Maximum heat stresses | Thermal resistance | Thermal resistance of junction when |
|---|---|---|---|---|---|
| | Thickness (μm) | Porosity (%) | applied solder layer (MPa) | of junction (K/W) | nanoparticle is not embedded (K/W) |
| Comparative example 1 | — | — | 1048 | 0.078 | — |
| Example 8 | 20 | 20 | 953 | 0.081 | 0.087 |
| Example 9 | 20 | 60 | 914 | 0.078 | 0.099 |
| Example 10 | 100 | 20 | 581 | 0.121 | 0.133 |
| Example 11 | 100 | 60 | 527 | 0.119 | 0.191 |
| Example 12 | 200 | 20 | 483 | 0.177 | |
| Example 13 | 200 | 60 | 420 | 0.200 | 0.306 |
| Comparative example 3 | 300 | 60 | 403 | 0.298 | |

As shown in TABLE 2, the heat stress applied to the solder layer 4 is reduced about 9% or more and 60% or less in the examples 8 to 13, compared with the comparative example 1. The value of the thermal resistance is held down so as to be 1.0 to 2.6 times as large as that of the comparative example 1.

An extent of a value of the thermal resistance suitable for a junction of a power semiconductor changes with the area size of the joint surface of the power semiconductor element 5. As the value of the thermal resistance of the junction of the power semiconductor in the case of the power semiconductor element 5 (having a length of 4 mm and a width of 6 mm) and the lead frame 2 which are used in this simulation, 0.2K/W or less per joint surface is desirable, and 0.15K/W or less per joint surface is more desirable.

In the comparative example 3, although the thermal stress is 403 Mpa and small enough, the value of the thermal resistance is 0.298K/W and a large value, it is not suitable for the junction of the power semiconductor.

In the examples 8 and 9 in which the thickness of the porous nickel plating 20 in which the nanodiamonds are embedded into the pores of the surface is 20 μm, the reduction of the heat stress is 10% or less compared with the comparative example 1. On the other hand, in the examples 10 to 13 in which the thickness of the porous nickel plating 20 in which the nanodiamonds are embedded into the pores of the surface is 100 μm or more, the reduction of the heat stress is 45% or more compared with the comparative example 1, and more effective stress reduction has been confirmed.

As shown in the examples 8 to 13 in TABLE 2, by embedding nanodiamonds into the surface of the porous nickel plating 20, the value of the thermal resistance of the junction can be reduced more compared with a porous nickel plating in which the nanodiamonds are not embedded.

Therefore, by embedding the nanodiamonds into the porous nickel plating, a suitable value of the thermal resistance can be obtained by the porous nickel plating with smaller thickness. The heat stress can be reduced more by enlarging the thickness of porous nickel plating with the low value of the thermal resistance maintained.

As described above, in the power semiconductor device in the second embodiment, the porous nickel plating 20 is applied to the lead frame 20, the nanoparticles 17 with high thermal conductivity are embedded into the pores 7 of the surface of the porous nickel plating 20 to the solder layer 4, and a layer with a low coefficient of linear expansion, a low modulus of elasticity, and a locally small thermal resistance lies between the semiconductor element 5 and the lead frame 2. Thereby, even when the power semiconductor element 5 heats, the lead frame expands greatly and a distortion occurs in the layer of porous nickel plating 20, the heat stress induced on the solder layer 4 is eased since the modulus of elasticity of the porous nickel plating 20 is low.

A heat warp is induced on the solder layer 4 by the difference of the coefficients of linear expansion of the porous nickel plating 20 and the power semiconductor element 5, but the difference is small, and the heat stress to the solder layer 4 is reduced. Furthermore, since the thermal resistance of the joint surface of the porous nickel plating 20 and the solder layer 4 is small, the thermal diffusion performance in the joint surface is improved, and the heat stress concentration of the junction boundary surface of the layer of the porous nickel plating 20 and the solder layer 4 in a thermal cycle is eased.

INDUSTRIAL APPLICABILITY

The semiconductor device and the method of manufacturing the semiconductor device according to the present invention have an effect of reducing a heat stress to the solder layers and can suppress an occurrence of a solder crack, with suppressing an increase of thermal resistance of a junction, and can be used in the field of a car, environment, a residence, and an infrastructure, for example, such as an inverter substrate of a motor of an electric vehicle or a power conditioner of a power generation system used indoors or outdoors.

| Description of Symbols | |
|---|---|
| 1, 20 | Porous nickel plating |
| 2 | Lead frame |
| 3 | Insulator |
| 4 | Solder layer |
| 5 | Power semiconductor element |
| 6 | Nickel plating tank |
| 7 | Pore |
| 8 | Heat radiation plate |
| 9 | Insulating resin |
| 10 | Cream solder |
| 11 | Second lead frame |
| 12, 21 | Second porous nickel plating |
| 13 | Mask |
| 14 | Second solder layer |
| 17 | Nanoparticle |
| 301 | Power semiconductor element |
| 302, 302a, 302b | Solder layer |
| 303 | Porous metal plate |
| 304 | Lead frame |
| 305 | Insulator |
| 306 | Heat radiation plate |

What is claimed is:

1. A semiconductor device comprising:
   a semiconductor element;
   a solder layer which is arranged on at least one surface of the semiconductor element; and
   a lead frame which is arranged on the solder layer so that a porous nickel plating part is sandwiched between the lead frame and the solder layer, wherein
   the porous nickel plating part has many pores, and
   particles having a thermal conductivity which is higher than that of nickel, are embedded in the pores which are located at a junction part of the porous nickel plating part to the solder layer.

2. The semiconductor device according to claim 1, wherein a thickness of the porous nickel plating part is 10 μm or more and 100 μm or less and a porosity of the porous nickel plating part is 20% or more and 60% or less.

3. The semiconductor device according to claim 1, wherein the porous nickel plating part is applied to the lead frame.

4. The semiconductor device according to claim 1, wherein a coefficient of linear expansion of the porous nickel plating part is larger than a coefficient of linear expansion of the semiconductor element, and smaller than a coefficient of linear expansion of the lead frame.

5. The semiconductor device according to claim 1, comprising:
   another solder layer which is arranged on such opposite surface of the semiconductor element, the opposite surface being opposite to the one surface of the semiconductor element on which the solder layer is arranged; and
   another lead frame which is arranged on the another solder layer so that another porous nickel plating part is sandwiched between the another lead frame and the another solder layer.

6. The semiconductor device according to claim 1, wherein a coefficient of linear expansion of the porous nickel plating part in which the particles are embedded, is larger than a coefficient of linear expansion of the semiconductor element, and smaller than a coefficient of linear expansion of the lead frame.

7. The semiconductor device according to claim 1, wherein the particles embedded in the pores are particles of a carbon material.

8. The semiconductor device according to claim 1, wherein a thickness of the porous nickel plating part is 10 μm or more and 200 μm or less and a porosity of the porous nickel plating part is 20% or more and 60% or less.

9. The semiconductor device according to claim 1, wherein a diameter of the particle embedded in the pore is 4 nm or more and 50 nm or less.

10. The semiconductor device according to claim 1, further comprising:
    another solder layer which is arranged on such opposite surface of the semiconductor element, the opposite surface being opposite to the one surface of the semiconductor element on which the solder layer is arranged; and
    another lead frame which is arranged on the another solder layer so that another porous nickel plating part having many pores is sandwiched between the another lead frame and the another solder layer, wherein
    particles having a thermal conductivity which is higher than that of nickel, are embedded in the pores which are located at a junction part of the another porous nickel plating part to the another solder layer.

11. The semiconductor device according to claim 2, wherein
    the porous nickel plating part is applied to the lead frame.

12. The semiconductor device according to claim 6, wherein
    the particles embedded in the pores are particles of a carbon material.

* * * * *

UNITED STATES PATENT AND TRADEMARK OFFICE
CERTIFICATE OF CORRECTION

Page 1 of 1

PATENT NO. : 8,816,481 B2
APPLICATION NO. : 13/822838
DATED : August 26, 2014
INVENTOR(S) : Keiko Ikuta et al.

It is certified that error appears in the above-identified patent and that said Letters Patent is hereby corrected as shown below:

On the Title Page:

Item (30), Foreign Application Priority Data, please enter
-- November 4, 2011   (JP) 2011-241873 -- and
-- January 10, 2012   (JP) 2012-002067 --.

Signed and Sealed this
Thirteenth Day of January, 2015

Michelle K. Lee
*Deputy Director of the United States Patent and Trademark Office*